(12) United States Patent
Jeon et al.

(10) Patent No.: US 8,431,939 B2
(45) Date of Patent: Apr. 30, 2013

(54) SEMICONDUCTOR LIGHT-EMITTING DEVICE

(75) Inventors: Soo Kun Jeon, Gyeonggi-do (KR); Eun Hyun Park, Gyeonggi-do (KR); Jong Won Kim, Gyeonggi-do (KR); Jun Chun Park, Gyeonggi-do (KR)

(73) Assignee: Semicon Light Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/498,656

(22) PCT Filed: Aug. 11, 2010

(86) PCT No.: PCT/KR2010/005250
§ 371 (c)(1),
(2), (4) Date: Apr. 18, 2012

(87) PCT Pub. No.: WO2011/040703
PCT Pub. Date: Apr. 7, 2011

(65) Prior Publication Data
US 2012/0193674 A1  Aug. 2, 2012

(30) Foreign Application Priority Data

| Sep. 30, 2009 | (KR) | 10-2009-0093159 |
| Oct. 6, 2009 | (KR) | 10-2009-0094765 |
| Oct. 22, 2009 | (KR) | 10-2009-0100515 |
| Nov. 27, 2009 | (KR) | 10-2009-0115694 |
| Dec. 31, 2009 | (KR) | 10-2009-0135491 |
| Dec. 31, 2009 | (KR) | 10-2009-0135498 |
| Dec. 31, 2009 | (KR) | 10-2009-0135502 |

(51) Int. Cl.
*H01L 21/00* (2006.01)

(52) U.S. Cl.
USPC ............ 257/79; 257/94; 257/98; 257/103; 257/E33.025; 257/E33.043

(58) Field of Classification Search ............ 257/77–99, 257/103, 431
See application file for complete search history.

(56) References Cited

U.S. PATENT DOCUMENTS

| 6,307,218 B1 | 10/2001 | Steigerwald et al. |
| 6,547,249 B2 | 4/2003 | Collins, III et al. |
| 6,781,147 B2 * | 8/2004 | Chen et al. ............ 257/11 |

(Continued)

FOREIGN PATENT DOCUMENTS

| JP | 08-008329 | 1/1996 |
| JP | 2000-049382 | 2/2000 |

(Continued)

*Primary Examiner* — Michael Lebentritt
(74) *Attorney, Agent, or Firm* — Harness, Dickey & Pierce, P.L.C.

(57) ABSTRACT

The present disclosure relates to a semiconductor light-emitting device which includes: a substrate having a first surface and a second surface; at least one semiconductor stacked body disposed on the first surface of the substrate and each including an active layer and first and second semiconductor layers disposed on both sides of the active layer, the first semiconductor layer having first conductivity, the second semiconductor layer having second conductivity different than the first conductivity, the first semiconductor layer having an exposed surface; a substrate piercing portion leading from the second surface to the first surface with a spacing from the exposed surface and opened without being covered with the at least one semiconductor stacked body; and an electrical path leading to the at least one semiconductor stacked body via the substrate piercing portion.

20 Claims, 21 Drawing Sheets

U.S. PATENT DOCUMENTS

| | | |
|---|---|---|
| 7,276,742 B2 | 10/2007 | Kohno et al. |
| 7,692,200 B2 * | 4/2010 | Kamikawa et al. ............. 257/79 |
| 7,709,858 B2 * | 5/2010 | Tsuda et al. .................. 257/103 |
| 7,903,710 B2 * | 3/2011 | Kamikawa et al. ........ 372/43.01 |
| 7,910,389 B2 * | 3/2011 | Kim et al. ....................... 438/48 |
| 8,067,780 B2 * | 11/2011 | Shieh et al. .................... 257/99 |
| 2005/0012109 A1 | 1/2005 | Kohno et al. |
| 2006/0138436 A1 * | 6/2006 | Chen et al. ..................... 257/98 |
| 2006/0163604 A1 | 7/2006 | Shin et al. |
| 2007/0096115 A1 | 5/2007 | Lee et al. |
| 2008/0029761 A1 | 2/2008 | Peng |
| 2008/0261341 A1 * | 10/2008 | Zimmerman et al. .......... 438/33 |
| 2008/0315240 A1 | 12/2008 | Kim et al. |
| 2010/0072504 A1 | 3/2010 | Lee |
| 2011/0041890 A1 * | 2/2011 | Sheats ........................... 136/244 |
| 2011/0127567 A1 * | 6/2011 | Seong ............................. 257/99 |
| 2012/0018746 A1 * | 1/2012 | Hsieh ............................. 257/88 |

FOREIGN PATENT DOCUMENTS

| | | |
|---|---|---|
| JP | 2002-359402 | 12/2002 |
| KR | 10-2005-0044518 | 5/2005 |
| KR | 10-0743471 | 7/2007 |
| KR | 10-2009-0073943 | 7/2009 |

* cited by examiner

SEMICONDUCTOR LIGHT-EMITTING DEVICE

CROSS-REFERENCE TO RELATED APPLICATIONS

This application is a U.S. national stage filing under 35 U.S.C. §371 of International Application No. PCT/KR2010/005250 filed Aug. 11, 2010, and claims priority to Korean Application No. 10-2009-0093159 filed Sep. 30, 2009, Korean Application No. 10-2009-0094765 filed Oct. 6, 2009, Korean Application No. 10-2009-0100515 filed Oct. 22, 2009, Korean Application No. 10-2009-0115694 filed Nov. 27, 2009, Korean Application No. 10-2009-0135491 filed Dec. 31, 2009, Korean Application No. 10-2009-0135498 filed Dec. 31, 2009 and Korean Application No. 10-2009-0135502 filed Dec. 31, 2009. The disclosures of the aforementioned applications are incorporated herein by reference in their entireties.

TECHNICAL FIELD

The present invention relates generally to a semiconductor light-emitting device and, more particularly, to a semiconductor light-emitting device wherein an electrical path or electrical connection is formed in a substrate.

Here, the semiconductor light-emitting device indicates a semiconductor optical device which generates light by recombination of electrons and holes, and its example is a III-nitride semiconductor light-emitting device. The III-nitride semiconductor is made of a compound containing $Al_{(x)}Ga_{(y)}In_{(1-x-y)}N$ ($0 \leq x \leq 1$, $0 \leq y \leq 1$, $0 \leq x+y \leq 1$). Another example is a GaAs semiconductor light-emitting device used for red light emission.

BACKGROUND ART

This section provides background information related to the present disclosure which is not necessarily prior art.

FIG. 1 is a view showing an example of a conventional semiconductor light-emitting device. The semiconductor light-emitting device includes a substrate 100, a buffer layer 200 grown on the substrate 100, an n-type semiconductor layer 300 grown on the buffer layer 200, an active layer 400 grown on the n-type semiconductor layer 300, a p-type semiconductor layer 500 grown on the active layer 400, a current spreading electrode 600 formed on the p-type semiconductor layer 500, a p-side bonding pad 700 formed on the current spreading electrode 600, an n-side electrode 800 formed on the n-type semiconductor layer 300 exposed by mesa-etching the p-type semiconductor layer 500 and the active layer 400, and a protective film 900.

FIG. 2 is a view showing an example of a conventional vertical-type semiconductor light-emitting device. An n-type semiconductor layer 300, an active layer 400 and a p-type semiconductor layer 500 are grown as in the semiconductor light-emitting device shown in FIG. 1, and then the substrate 100 is removed. A current spreading electrode 600 and a p-side bonding pad 700 are formed on the p-type semiconductor layer 500, while an n-side electrode 800 is formed on the n-type semiconductor layer 300. As compared with the semiconductor light-emitting device shown in FIG. 1, the vertical-type semiconductor light-emitting device has advantages in that current spreading can be facilitated in the light-emitting device and that wire bonding can be reduced. However, a laser is used to remove the substrate 100, such that the semiconductor layers 300, 400 and 500 may be damaged during the removal of the substrate 100 or irradiation of the laser.

FIGS. 3 and 4 are views showing examples of a semiconductor light-emitting device described in Japan Laid-Open Patent Publication No. H08-083929. A rear electrode 820 is made of a conductive material, disposed on the rear surface of a substrate 100, and electrically connected to an n-type semiconductor layer 300 through a hole 110 formed in the substrate 100 and semiconductor layers 200 and 300. In order to manufacture this vertical-type semiconductor light-emitting device, considering that the rear electrode 820 is disposed on the rear surface of the substrate 100 which is an electric insulator, it is necessary to form an electrical connection or electrical path 810 in the substrate 100. However, there is a problem in that the n-type semiconductor layer 300 is damaged during a process of forming the hole 110 by a laser.

DETAILED DESCRIPTION

Technical Problem

The problems to be solved by the present disclosure will be described in the latter part of the best mode for carrying out the invention.

Technical Solution

This section provides a general summary of the disclosure and is not a comprehensive disclosure of its full scope or all of its features.

According to one aspect of the present disclosure, there is provided a semiconductor light-emitting device which includes: a substrate having a first surface and a second surface; at least one semiconductor stacked body disposed on the first surface of the substrate and each including an active layer and first and second semiconductor layers disposed on both sides of the active layer, the first semiconductor layer having first conductivity, the second semiconductor layer having second conductivity different than the first conductivity, the first semiconductor layer having an exposed surface; a substrate piercing portion leading from the second surface to the first surface with a spacing from the exposed surface and opened without being covered with the at least one semiconductor stacked body; and an electrical path leading to the at least one semiconductor stacked body via the substrate piercing portion.

Advantageous Effects

The advantageous effects of the present disclosure will be described in the latter part of the best mode for carrying out the invention.

BEST MODE FOR CARRYING OUT THE INVENTION

The present disclosure will now be described in detail with reference to the accompanying drawings.

Figure 5:
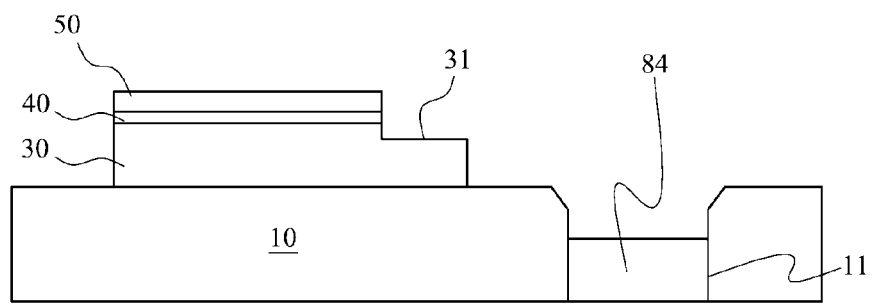
FIG. 5 is a view for explaining the principle of technical ideas of the present disclosure.

FIG. 5 is a view for explaining the principle of technical ideas of the present disclosure. First, an n-type semiconductor layer 30, an active layer 40 and a p-type semiconductor layer 50 are formed on a substrate 10. These semiconductor layers 30, 40 and 50 constitute a semiconductor stacked body. For example, the substrate 10 may be a sapphire substrate which is an insulating substrate, and the semiconductor used may be a III-nitride semiconductor layer. Preferably, a buffer layer may be used prior to the growth of the n-type semiconductor layer. A substrate piercing portion 11 is formed through the substrate 10, separated from the semiconductor layers 30, 40 and 50 or spaced apart from an exposed surface 31 formed on the n-type semiconductor layer 30. An electrical connection or electrical path 84 is formed in the substrate piercing portion 11 using a conductive material. The electrical path 84 serves to supply current from the rear surface of the substrate 10 to the semiconductor layers 30, 40 and 50. The present disclosure relates to a semiconductor light-emitting device, wherein the electrical path is formed through the substrate 10 and electrically connected to the n-type semiconductor layer 30 and/or the p-type semiconductor layer 50.

Figure 6:
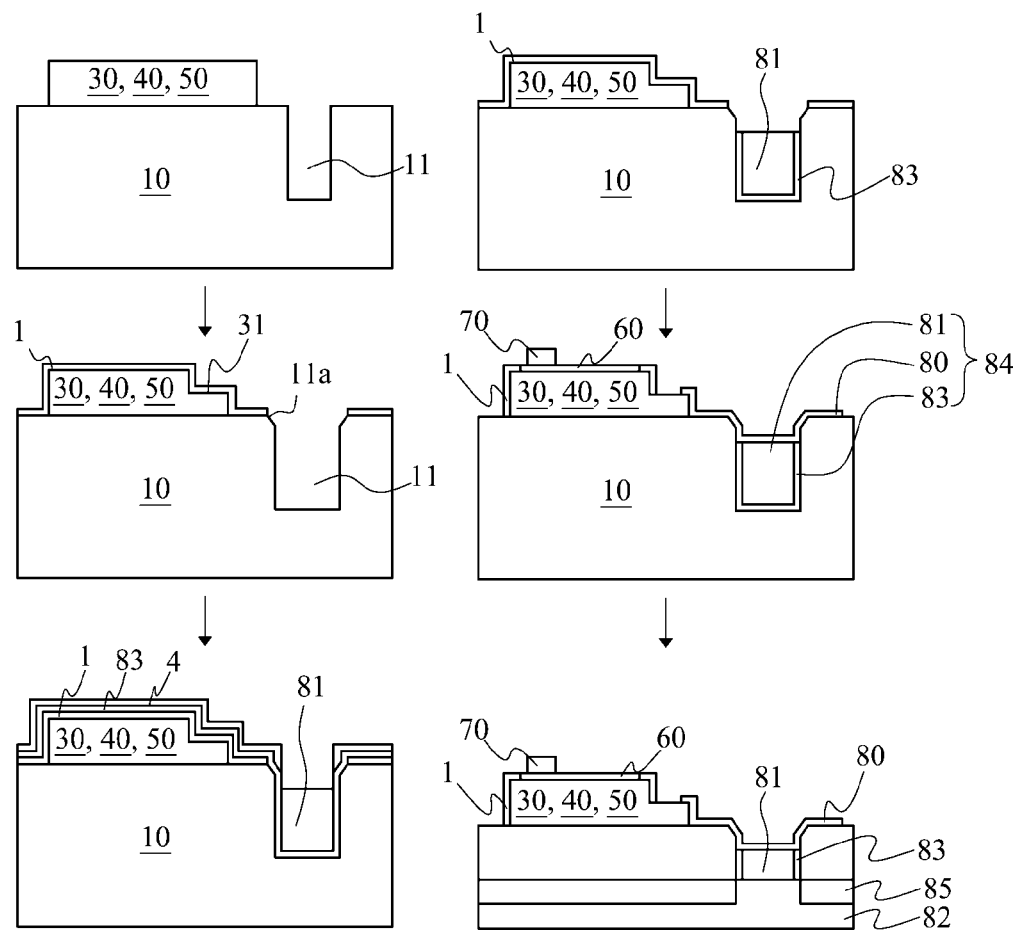
FIG. 6 is a view showing an embodiment of a semiconductor light-emitting device according to the present disclosure and a manufacturing method thereof.

FIG. 6 is a view showing an embodiment of a semiconductor light-emitting device according to the present disclosure and a manufacturing method thereof. First, an n-type semiconductor layer 30, an active layer 40 and a p-type semiconductor layer 50 are formed on a substrate 10, and then part of the semiconductor layers 30, 40 and 50 is removed by an etching process. Preferably, the n-type semiconductor layer 30 is completely removed to expose the substrate 10. The reason for this is to certainly prevent the semiconductor layers 30, 40 and 50 from being damaged by heat generated in a laser process, which will be explained later. The etching may be dry etching such as RIE, RIBE, ICP, etc. Next, a substrate piercing portion 11 is formed in the substrate 10, for example, by laser machining. Preferably, a laser used is a diode-pumped (UV) laser, and the substrate piercing portion 11 has a diameter of 10 μm to 40 μm and a depth of 60 μm to 300 μm.

Next, an exposed surface 31 is formed on the n-type semiconductor layer 30 by etching. This may be done prior to the laser machining. Preferably, the substrate piercing portion 11 is formed first, and its inlet is extended to form an extended portion 11a. In order to form the extended portion 11a, a mask 1 (e.g., SiO$_2$) is formed, and then etching is performed at 200° C. or higher for about 5 minutes using a phosphoric acid solution, for example. The extended portion 11a assists in forming an electrical path in the narrow substrate piercing portion 11.

Next, a metal film 83 is deposited. The metal film 83 may be made of Ti, Al, Ni, Au or Cr, or a combination thereof, and functions as a seed or supplies current in the succeeding plating process. The deposition may be E-beam deposition, sputter deposition, thermal evaporation, etc. Next, a mask 4 (e.g., photoresist) is formed. The photoresist is coated by spin-coating. It is not introduced into the substrate piercing portion 11 due to a surface tension but disposed around the substrate piercing portion 11 as shown. In this case, there is an advantage of using the photoresist as in the self-alignment without a separate mask process. In this situation, an insert 81 is formed in the substrate piercing portion 11. The insert 81 serves to prevent a metal material, paste, etc. used in the succeeding process from moving toward the semiconductor layers 30, 40 and 50 through the substrate piercing portion 11 or to ensure that the electrical path 84 is formed between an n-side electrode 80 and the rear surface of the substrate 10. When the insert 81 is made of a conductive material, it can be formed by plating. Example plating materials may include Cu, Ni, Au, Ag, Al, etc., and example plating methods may include electrolytic plating, non-electrolytic plating, etc. For example, Cu electrolytic plating can be performed at 50 mA of current by using cuprabase50 as a plating solution. Here, a processing time is about 100 minutes.

Next, the metal film 83 and the mask 4 are removed.

Figure 1:
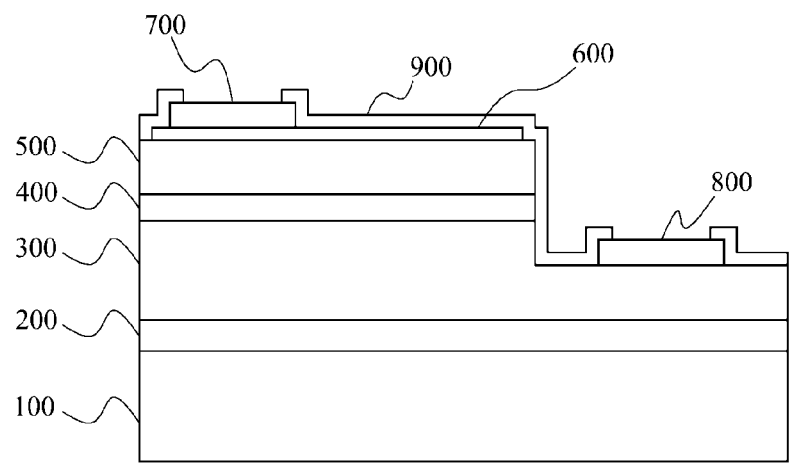
FIG. 1 is a view showing an example of a conventional semiconductor light-emitting device.
Figure 2:
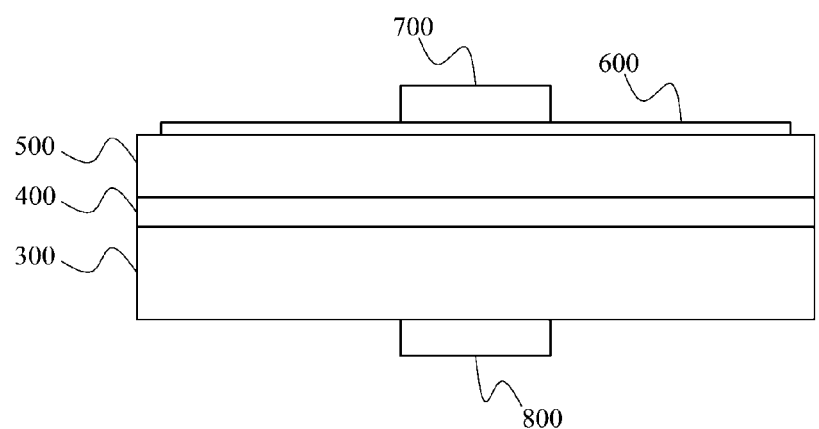
FIG. 2 is a view showing an example of a conventional vertical-type semiconductor light-emitting device.
Figure 3:
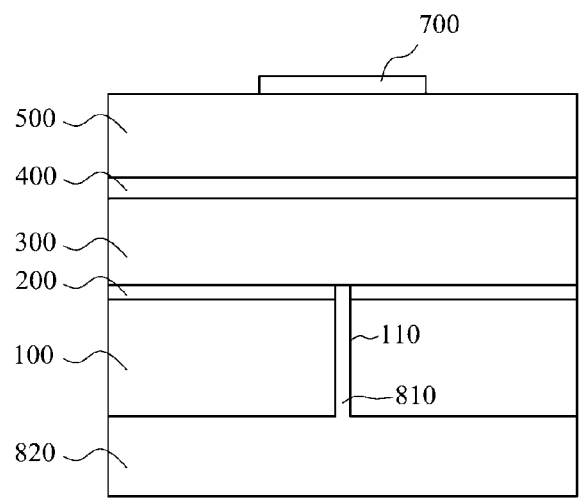
FIGS. 3 and 4 are views showing examples of a semiconductor light-emitting device described in Japan Laid-Open Patent Publication No. H08-083929.
Figure 4:
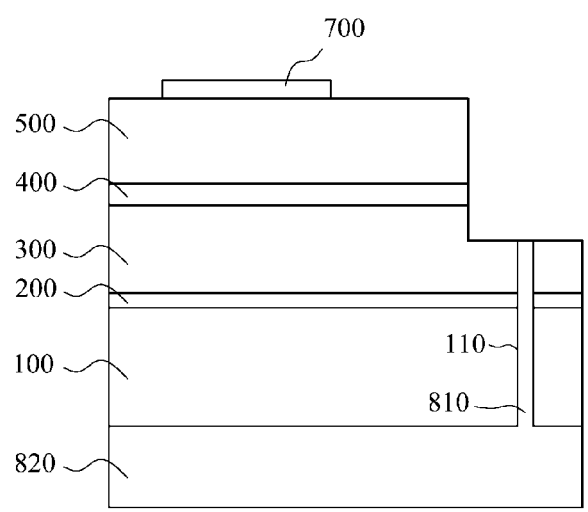

Finally, part of the mask 1 is removed, a current spreading electrode 60 made of ITO is formed, and a p-side bonding pad 70 and an n-side electrode 80 are formed. The n-side electrode 80 serves to electrically connect the n-type semiconductor layer 30 to the insert 81. It can be seen that the mask 1 serves as the protective film 900 shown in FIG. 1. Here, the metal film 83, the insert 81 and the n-side electrode 80 constitute an electrical path 84.

Additionally, a rear electrode 82 can be introduced. Moreover, when the rear electrode 82 is used as a reflective plate, a light absorption barrier layer 85 made of SiO$_2$, TiO$_2$, CaF, MgF or the like is introduced between the substrate 10 and the rear electrode 82, which makes it possible to improve light extraction efficiency of the light-emitting device.

Meanwhile, the current spreading electrode 60 may be provided as a reflective plate containing Au, instead of a light-transmitting electrode made of ITO, thereby forming a flip chip.

Figure 7:
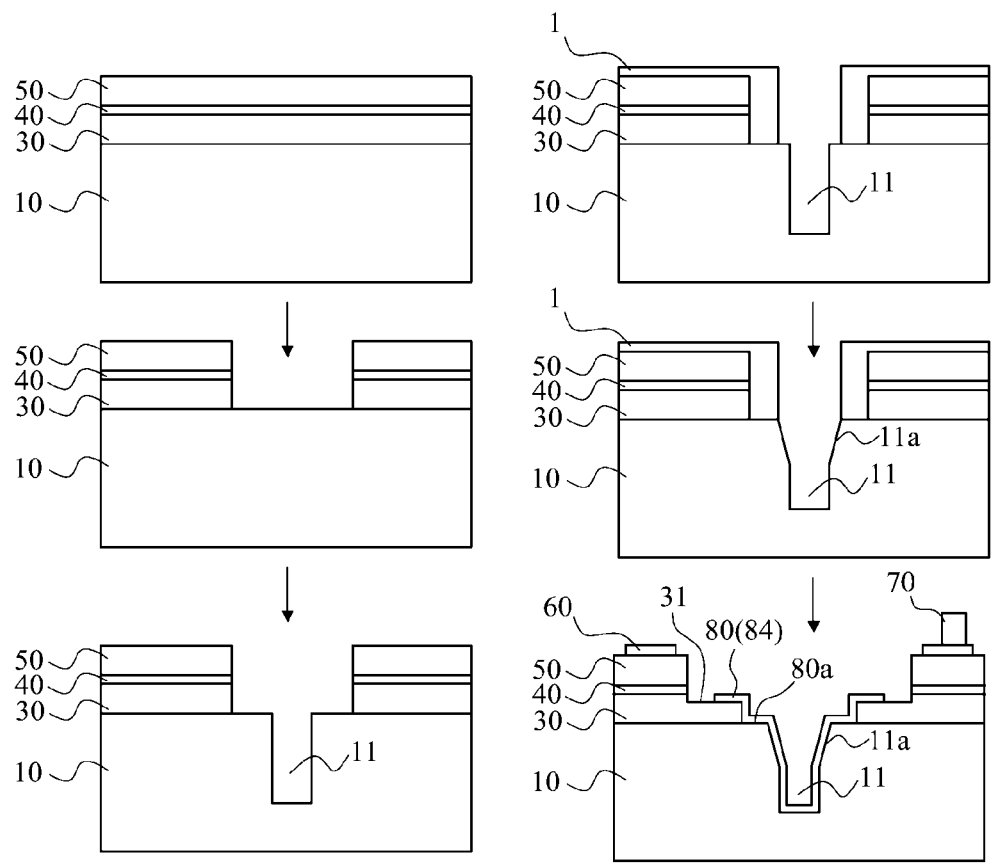
FIG. 7 is a view showing another embodiment of a semiconductor light-emitting device according to the present disclosure and a manufacturing method thereof.

FIG. 7 is a view showing another embodiment of a semiconductor light-emitting device according to the present disclosure and a manufacturing method thereof. First, an n-type semiconductor layer 30, an active layer 40 and a p-type semiconductor layer 50 are formed on a substrate 10.

Next, part of the n-type semiconductor layer 30, the active layer 40 and the p-type semiconductor layer 50 is removed by an etching process. Preferably, the diameter of the exposed portion ranges from 30 µm to 300 µm.

Next, a substrate piercing portion 11 is formed in the substrate 10, e.g., by laser machining.

Next, a mask 1 is formed. The mask 1 may be made of $SiO_2$.

Next, an inlet of the substrate piercing portion 11 is extended by etching to form an extended portion 11a.

Next, the mask 1 is removed, and a current spreading electrode 60, a p-side bonding pad 70 and an n-side electrode 80 are formed by a photolithography process. An exposed surface 31 may be formed prior to a process of exposing the substrate 10. The n-side electrode 80 leads from the n-type semiconductor layer 30 to the substrate piercing portion 11 via the exposed surface of the substrate 10 and the extended portion 11a and has a step 80a on the substrate 10 due to the n-type semiconductor layer 30.

Then, the substrate 10 is polished so that the substrate piercing portion 11 can pierce through it, and a separation process (e.g., scribing and braking) is performed to make a separate chip.

According to the semiconductor light-emitting device and the manufacturing method thereof, it is possible for the n-side electrode 80 to communicate with the rear surface of the substrate 10 without removing the substrate 10 from the semiconductor layers 30, 40 and 50. In addition, damages to the semiconductor layers 30, 40 and 50 can be minimized when the substrate piercing portion 11 is formed by a laser. Preferably, the substrate piercing portion 11 has the extended portion 11a, which ensures that the n-side electrode 80 leads to the substrate piercing portion 11. Here, the n-side electrode 80 constitutes an electrical path 84.

Figure 8:
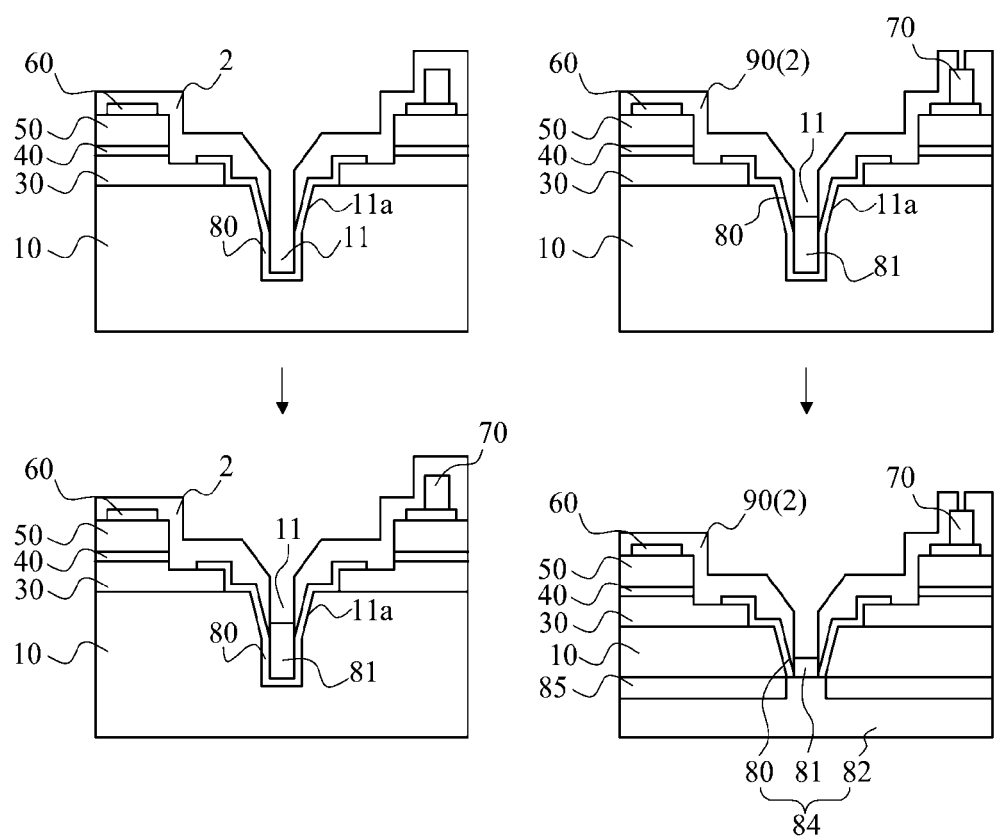
FIG. 8 is a view showing a further embodiment of a semiconductor light-emitting device according to the present disclosure and a manufacturing method thereof.

FIG. 8 is a view showing a further embodiment of a semiconductor light-emitting device according to the present disclosure and a manufacturing method thereof. Unlike the semiconductor light-emitting device shown in FIG. 7, a mask 2 is formed before polishing a substrate 10. For example, the mask 2 may be made of $SiO_2$, photoresist, or the like.

Next, an insert 81 is formed.

Next, a protective film 90 is formed with a p-side bonding pad 70 exposed. As compared with a case in which the mask 2 is made of photoresist, when the mask 2 is made of $SiO_2$, this process can be completed simply by removing $SiO_2$ on the p-side bonding pad 70.

Next, the substrate 10 is polished so that the insert 81 can be exposed. In this situation, a rear electrode 82 is formed on the whole or part of the rear surface of the substrate 10. The rear electrode 82 may be formed on the entire rear surface of the substrate 10 to function as a reflective plate or may be formed on part of the rear surface of the substrate 10 to function as a pad of a flip chip. When the rear electrode 82 is used as the reflective plate, a light absorption barrier layer 85 made of $SiO_2$, $TiO_2$, CaF, MgF or the like is introduced between the substrate 10 and the rear electrode 82, which makes it possible to improve light extraction efficiency of the light-emitting device. Here, the n-side electrode 80 and the insert 81 made of a conductive material may be regarded as an electrical path 84, or the n-side electrode 80, the insert 81 and the rear electrode 82 may be regarded as the electrical path 84.

Figure 9:
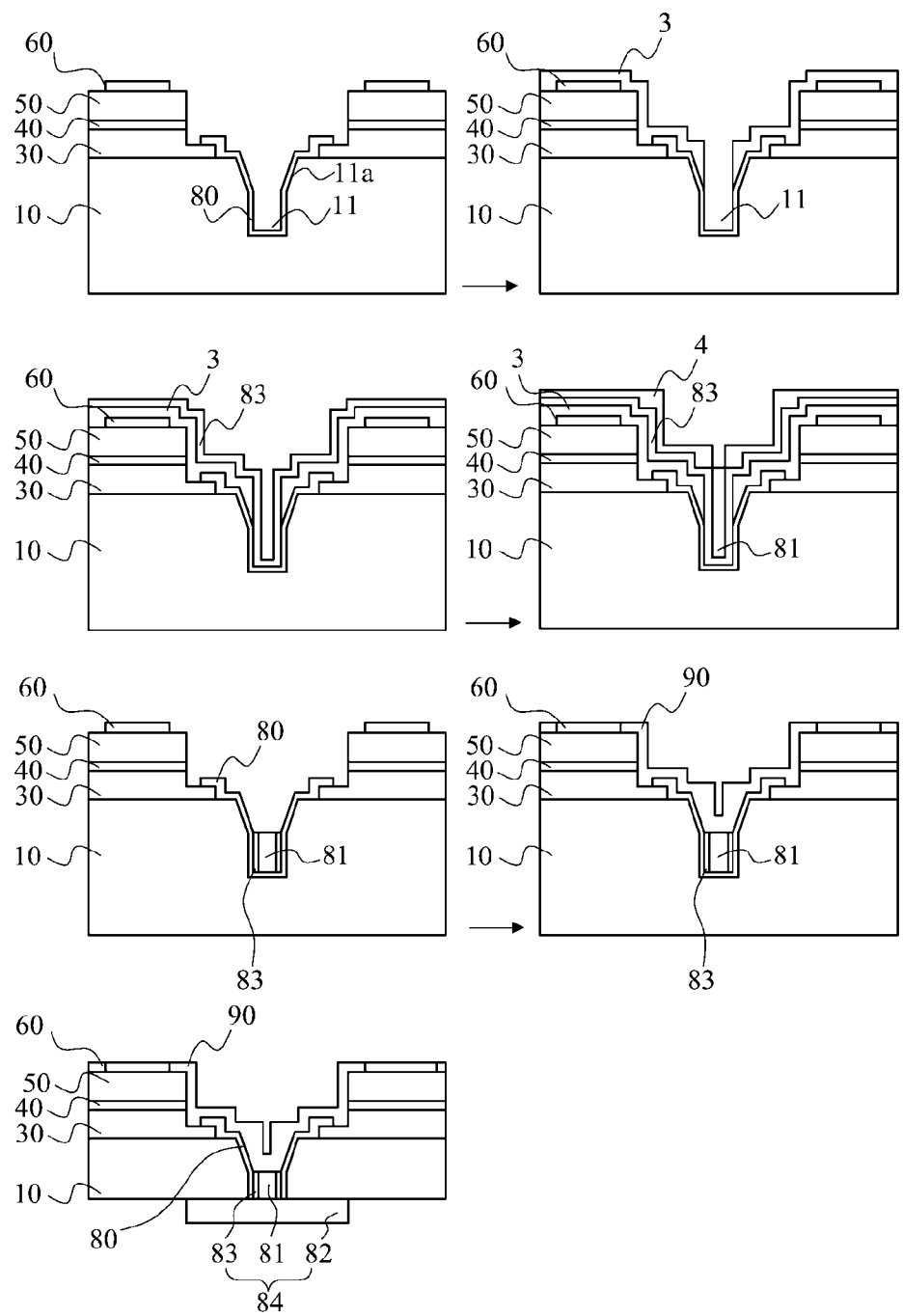
FIG. 9 is a view showing a still further embodiment of a semiconductor light-emitting device according to the present disclosure and a manufacturing method thereof.

FIG. 9 is a view showing a still further embodiment of a semiconductor light-emitting device according to the present disclosure and a manufacturing method thereof, particularly, a method of forming a flip chip.

First, an extended portion 11a is formed as in the semiconductor light-emitting device shown in FIG. 7, and then a current spreading electrode 60 and an n-side electrode 80 are formed.

Next, a mask 3 is formed. For example, the mask 3 may be made of photoresist. The photoresist is coated by spin-coating. It is not introduced into the substrate piercing portion 11 due to a surface tension but disposed around the substrate piercing portion 11 as shown. In this case, there is an advantage of using the photoresist as in the self-alignment without a separate mask process.

Next, preferably, a metal film 83 is deposited. The metal film 83 may be made of Ti, Al, Ni, Au or Cr, or a combination thereof, and serves to supply current in the succeeding plating process. The deposition may be E-beam deposition, sputter deposition, thermal evaporation, etc.

Next, in a state where a mask 4 is formed (e.g., by spin-coating the photoresist), an insert 81 is formed.

Next, the mask 3 and the mask 4 are removed. Here, the overlying metal film 83 is also removed.

Next, a protective film 90 is formed.

Next, the rear surface of the substrate 10 is polished, and a rear electrode 82 is formed. Here, the n-side electrode 80, the insert 81 made of a conductive material, and the metal film 83 may be regarded as an electrical path 84, or the n-side electrode 80, the insert 81, the metal film 83 and the rear electrode 82 may be regarded as the electrical path 84.

Figure 10:
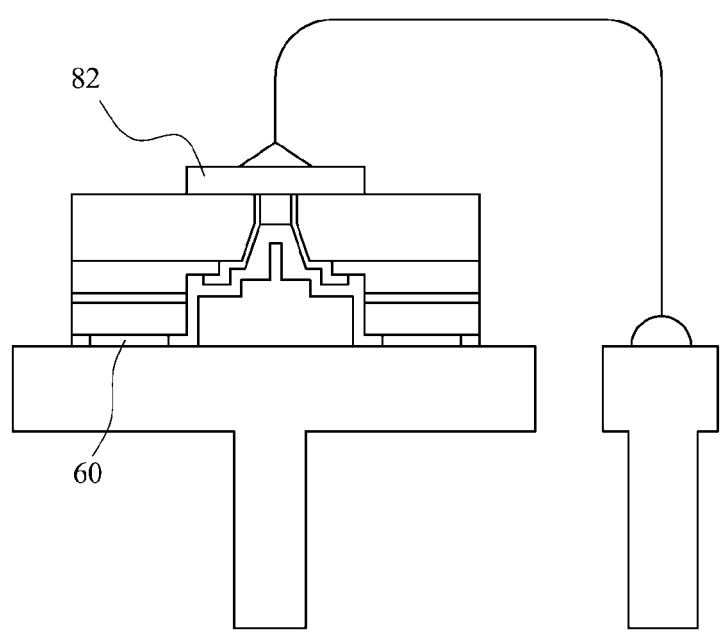
FIG. 10 is a view showing the semiconductor light-emitting device of FIG. 9 in a used state.

FIG. 10 is a view showing the semiconductor light-emitting device of FIG. 9 in a used state. The rear electrode 82 is shown on the top side. Eutectic bonding using AuSn, bonding using Ag paste, etc. may be used for bonding of the current spreading electrode 60.

Figure 11:
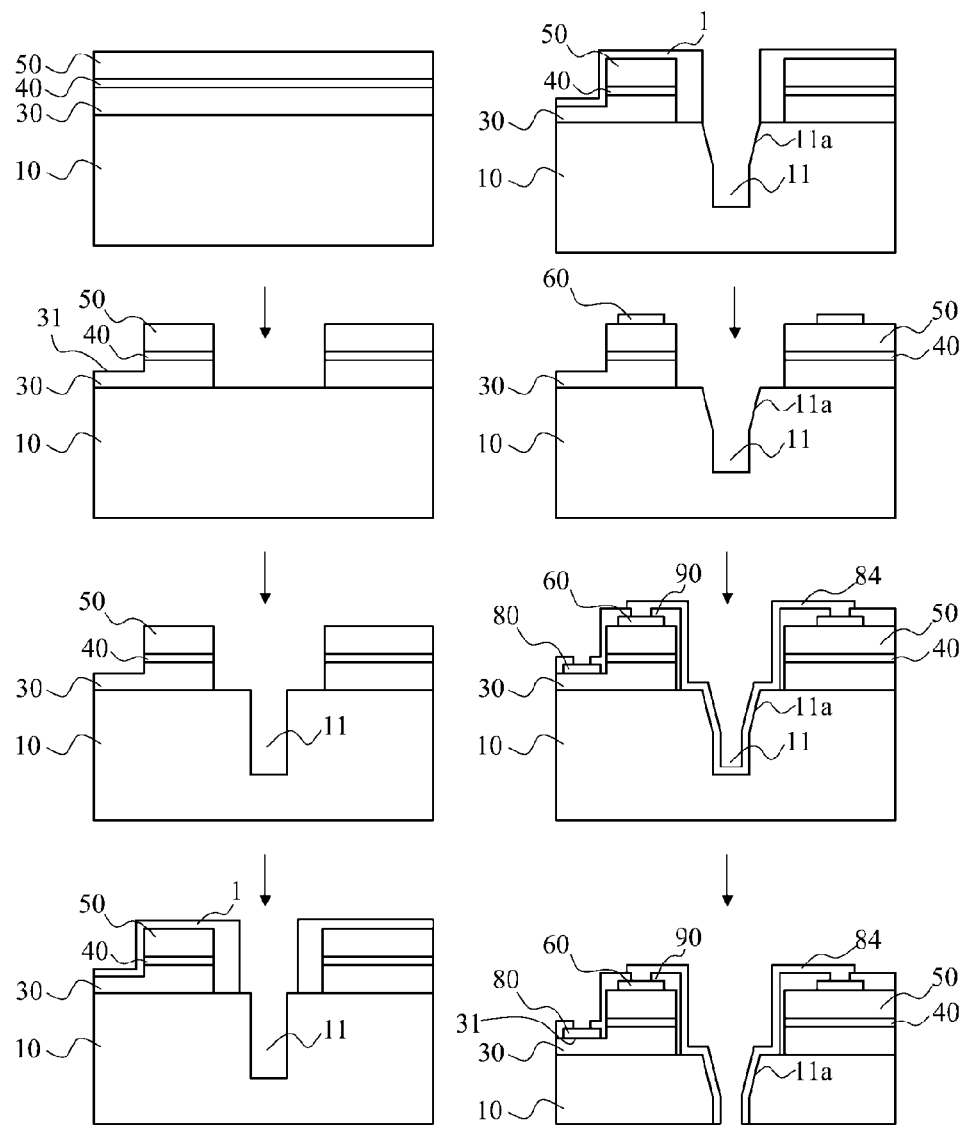
FIG. 11 is a view showing a still further embodiment of a semiconductor light-emitting device according to the present disclosure and a manufacturing method thereof.

FIG. 11 is a view showing a still further embodiment of a semiconductor light-emitting device according to the present disclosure and a manufacturing method thereof. First, an n-type semiconductor layer 30, an active layer 40 and a p-type semiconductor layer 50 are sequentially formed on a substrate 10.

Next, part of the n-type semiconductor layer 30, the active layer 40 and the p-type semiconductor layer 50 is removed by an etching process. An exposed surface 31 is also formed.

Next, a substrate piercing portion 11 is formed in the substrate 10.

Next, a mask 1 is formed. For example, the mask 1 may be made of $SiO_2$.

Next, an inlet of the substrate piercing portion 11 is extended by etching to form an extended portion 11a.

Next, the mask 1 is removed, and a current spreading electrode 60 is formed. The current spreading electrode 60 may be provided as a light-transmitting electrode made of ITO.

Next, a protective film 90 is formed, and then an electrical path 84 is formed. The electrical path 84 leads from the current spreading electrode 60 to the substrate piercing portion 11 via the exposed surface of the substrate 10 and the extended portion 11a. The extended portion 11a definitely ensures that the electrical path 84 leads to the rear surface of the substrate 10.

Finally, the substrate 10 is polished so that the substrate piercing portion 11 can be open, and a separation process (e.g., scribing and braking) is performed to make a separate chip.

The electrical path 84 can be formed by E-beam deposition, thermal evaporation, sputter deposition, etc. to make stable electrical contact with the current spreading electrode 60. The deposition may be performed using a combination of at least two of Ti, Cr, Au, Ni, Pt, Al, Cu, AgAl, CuAg, etc. For example, Ti—Au or Cr—Ni—Au can be used, and Ag, which is difficult to use due to high reflectivity, can also be used. In this case, the n-side electrode 80 is separately formed on the exposed surface 31. It may be deposited together with the electrical path 84 or by a separate process. It will be appreciated that the electrical path 84 can also be formed by another method described above.

Figure 12:
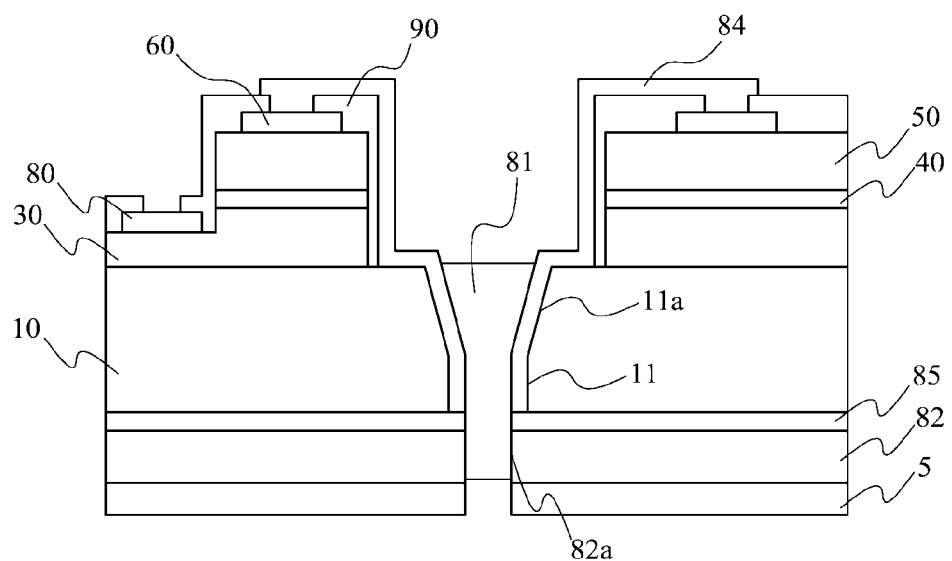
FIG. 12 is a view showing a still further embodiment of a semiconductor light-emitting device according to the present disclosure.

FIG. 12 is a view showing a still further embodiment of a semiconductor light-emitting device according to the present disclosure. A light absorption barrier layer 85 made of $SiO_2$, $TiO_2$, CaF, MgF or the like, a rear electrode 82 having an opening 82a, and an insert 81 are provided on the rear surface of the semiconductor light-emitting device shown in FIG. 11. When the insert 81 is plated, the rear electrode 82 may function as a seed of plating. Therefore, the plating is performed using a mask 5 such as photoresist. This process prevents the rear electrode 82 from getting thicker due to the plating and allows the semiconductor light-emitting device to be easily separated into individual chips.

Figure 13:
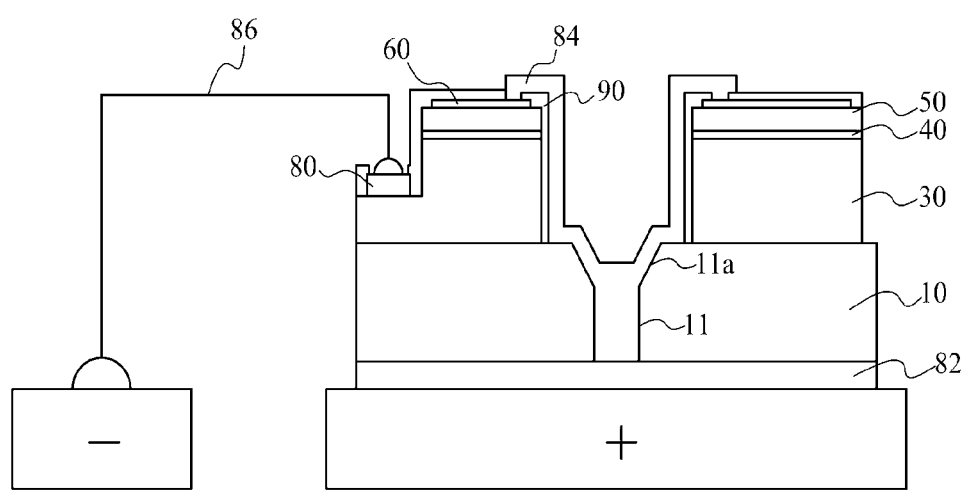
FIG. 13 is a view showing the semiconductor light-emitting device of FIG. 11 in a used state.

FIG. 13 is a view showing the semiconductor light-emitting device of FIG. 11 in a used state. A wire 86 is bonded only to the n-side electrode 80 which functions as a bonding pad. The electrical path 84 leading to the rear surface of the substrate 10 is used to electrically connect the current spreading electrode 60 to the outside. Thus, the number of wire bonding can be reduced. Duplicate description of same reference numbers will be omitted.

Figure 14:
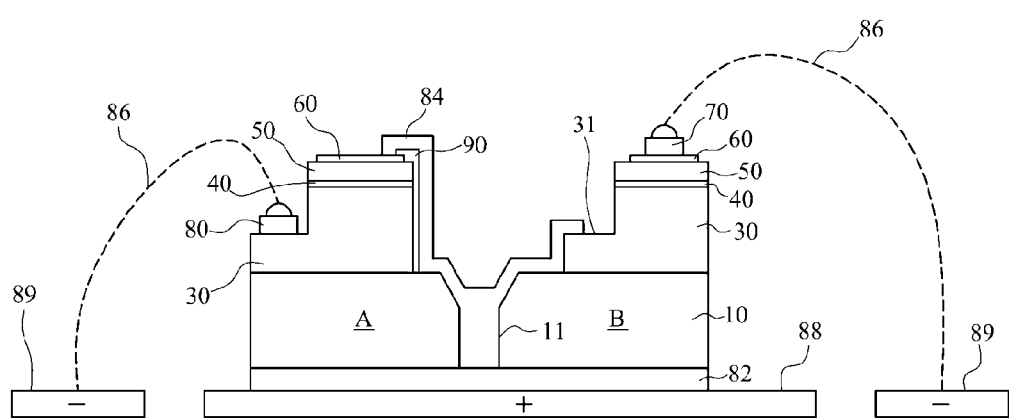
FIG. 14 is a view showing one electrical path according to the present disclosure.

FIG. 14 is a view showing one electrical path according to the present disclosure. The electrical path 84 leads to the current spreading electrode 60 of the left semiconductor stacked body A and also leads to the exposed surface 31 of the right semiconductor stacked body B. The left semiconductor stacked body A and the right semiconductor stacked body B are separated by etching. The rear electrode 82 is placed on a (+) electrode region 88 of a wiring board to be electrically connected thereto, and the p-side bonding pad 70 of the right semiconductor stacked body B and the n-side electrode 80 of the left semiconductor stacked body A are connected to a (−) electrode region 89 of the wiring board by a wire 86, respectively, to be electrically connected to each other. In this configuration, the left semiconductor stacked body A and the right semiconductor stacked body B, which are a pn diode, are connected in parallel with reverse polarity (in the reverse direction), so that the right semiconductor stacked body B can be used as an ESD protecting element relative to the left semiconductor stacked body A. It will be appreciated that the semiconductor stacked bodies A and B can also be connected in parallel in the forward direction.

Figure 15:
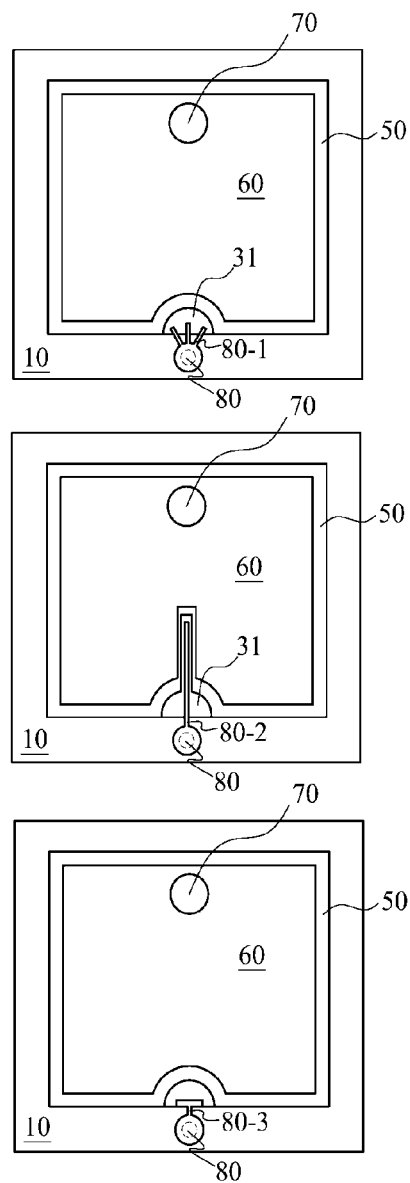
FIG. 15 is a view showing another electrical path according to the present disclosure.

FIG. 15 is a view showing another electrical path according to the present disclosure. The n-side electrode 80 is not formed generally in a circular shape but provided with a finger 80-1, 80-2 and 80-3 to contact the exposed surface 31. The use of the finger 80-1 reduces light absorption by the n-side electrode 80, the use of the finger 80-2, which extends lengthwise into the semiconductor light-emitting device, enables current to be smoothly supplied to the entire semiconductor light-emitting device by one electrical path 84, and the use of the T-shaped finger 80-3 reduces light absorption by the n-side electrode 80, while facilitating current supply by increasing an ohmic contact surface. Duplicate description of same reference numbers will be omitted. It will be appreciated that the finger can also be used in the semiconductor light-emitting devices shown in FIGS. 12 and 14.

Figure 16:
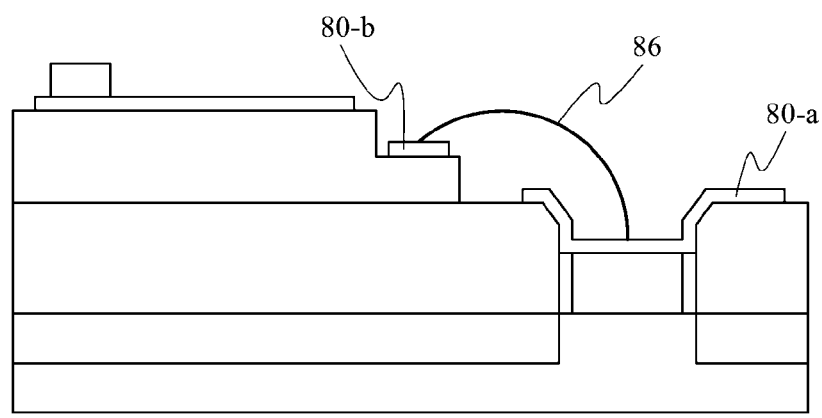
FIG. 16 is a view showing a further electrical path according to the present disclosure.

FIG. 16 is a view showing a further electrical path according to the present disclosure. The n-side electrode is divided into an n-side electrode 80-a and an n-side electrode 80-b and connected by a wire 86.

Figure 17:
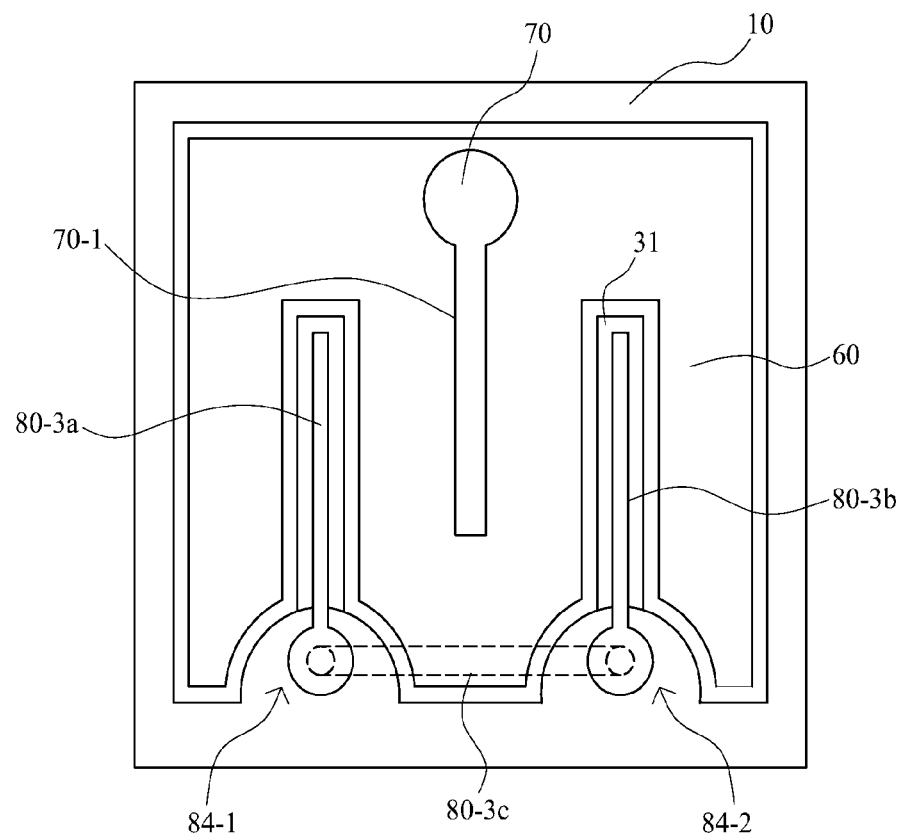
FIG. 17 is a view showing a still further electrical path according to the present disclosure.

FIG. 17 is a view showing a still further electrical path according to the present disclosure. An electrical path 84-1 having a finger 80-3a and an electrical path 84-2 having a finger 80-3b are formed on a substrate 10 and connected to each other not on the front surface but on the rear surface of the substrate 10 by a finger 80-3. In the large-area semiconductor light-emitting device having a plurality of fingers, this configuration serves to reduce light absorption by the fingers on the front surface of the semiconductor light-emitting device. When a rear electrode (82, not shown) functioning as a reflective plate is used, it can contribute to the connection. Duplicate description of same reference numbers will be omitted.

Figure 18:
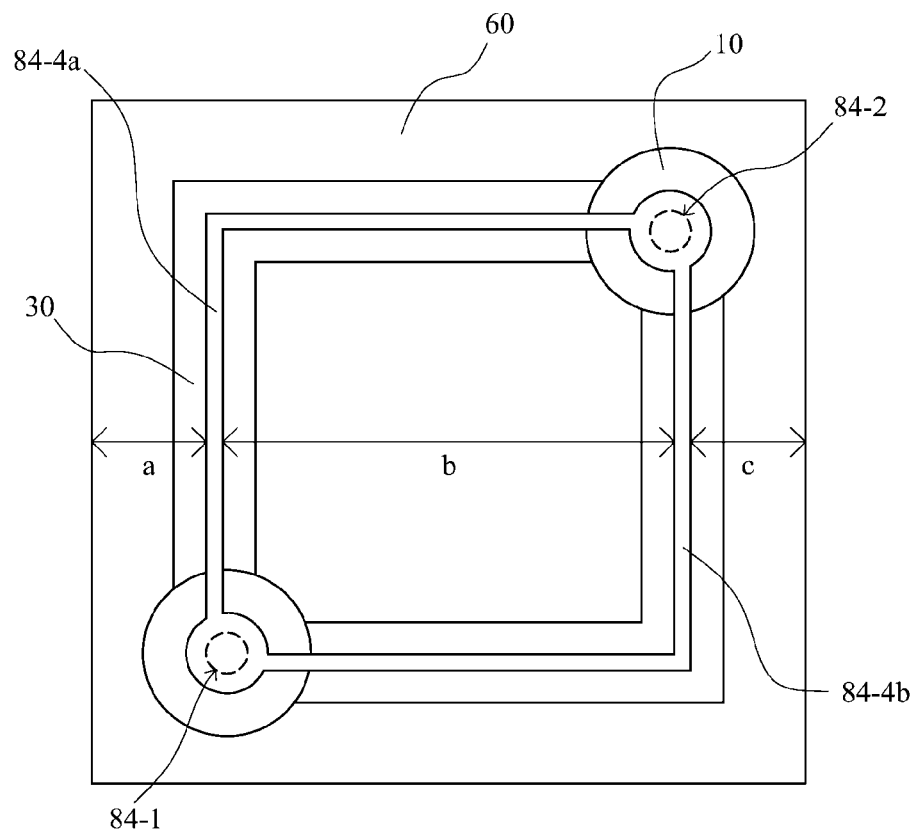
FIG. 18 is a view showing a still further electrical path according to the present disclosure.

FIG. 18 is a view showing a still further electrical path according to the present disclosure, particularly, a flip chip using a current spreading electrode 60, which is a reflective plate mostly made of Ag, and electrical paths 84-1 and 84-2, which are formed on the exposed surface 31 and have fingers 84-4a and 84-4b. Here, a spacing (b) between the fingers 84-4a and 84-4b is set larger than a spacing (a, c) between the side of the semiconductor light-emitting device and the fingers 84-4a and 84-4b to control current spreading in the entire light-emitting device. More specifically, when the fingers 84-4a and 84-4b form a closed loop, current concentration in the closed loop can be overcome. Meanwhile, in the case of the flip chip, since light is emitted through the rear surface of the substrate, it is more preferable to electrically connect the fingers 84-4a and 84-4b on the front surface of the substrate (e.g., to form the closed loop) than on the rear surface of the substrate in terms of light extraction efficiency.

Figure 19:
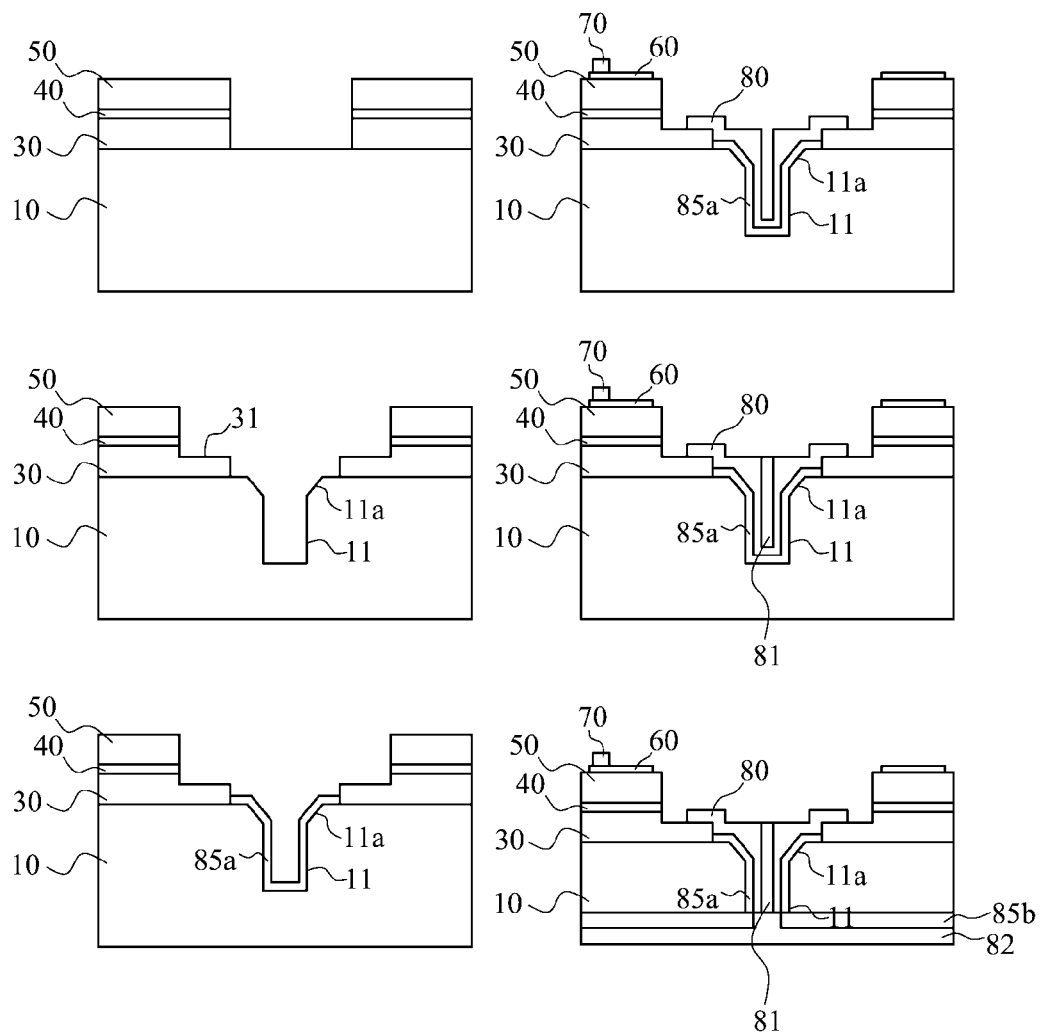
FIG. 19 is a view showing a still further embodiment of a semiconductor light-emitting device according to the present disclosure and a manufacturing method thereof.

FIG. 19 is a view showing a still further embodiment of a semiconductor light-emitting device according to the present disclosure and a manufacturing method thereof. First, an n-type semiconductor layer 30, an active layer 40 and a p-type semiconductor layer 50 are formed on a substrate 10 and etched to expose the substrate 10.

Next, a substrate piercing portion 11 having an extended portion 11a and an exposed surface 31 are sequentially formed on the substrate 10.

Next, a first light absorption barrier layer 85a (e.g., $SiO_2$) is formed. The first light absorption barrier layer 85a may be formed only in the substrate piercing portion 11.

Next, a current spreading electrode 60 is formed by a photolithography process, and a p-side bonding pad 70 and an n-side electrode 80 are deposited.

Next, an insert 81 is filled in the substrate piercing portion 11.

Next, the substrate 10 is polished, a second light absorption barrier layer 85b made of $SiO_2$, $TiO_2$, CaF, MgF or the like is formed, and a rear electrode 82 is formed.

The first light absorption barrier layer 85a serves to reduce light absorption by the electrical path in the substrate piercing portion 11.

Figure 20:
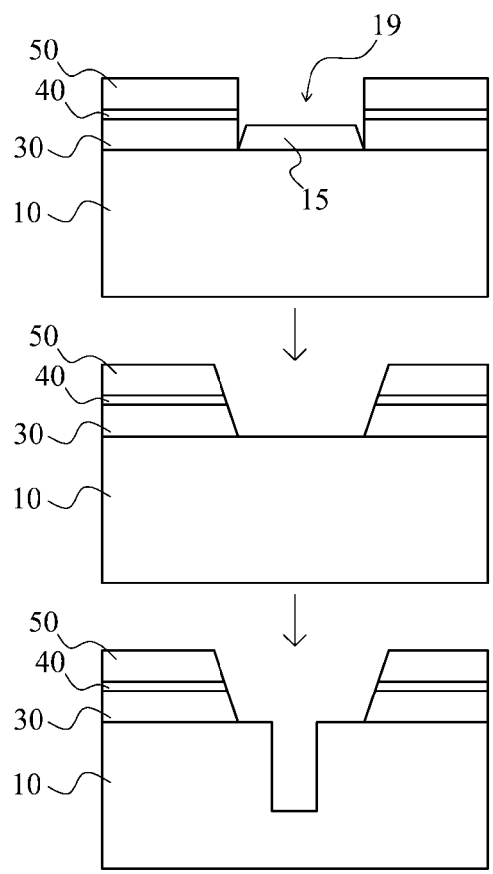
FIG. 20 is a view showing a still further embodiment of a manufacturing method of a semiconductor light-emitting device according to the present disclosure.

FIG. 20 is a view showing a still further embodiment of a manufacturing method of a semiconductor light-emitting device according to the present disclosure. First, a growth barrier film 15 (e.g., $SiO_2$) is formed on a substrate 10, and semiconductor layers 30, 40 and 50 are grown. Since the growth barrier film 15 prevents the semiconductor layers 30, 40 and 50 from being grown in a region in which a substrate piercing portion 11 is to be formed, there is an advantage of omitting the succeeding process of removing them.

Next, the growth barrier film 15 is removed.

Next, the substrate piercing portion 11 is formed. The succeeding process is the same as in the above.

Figure 21:
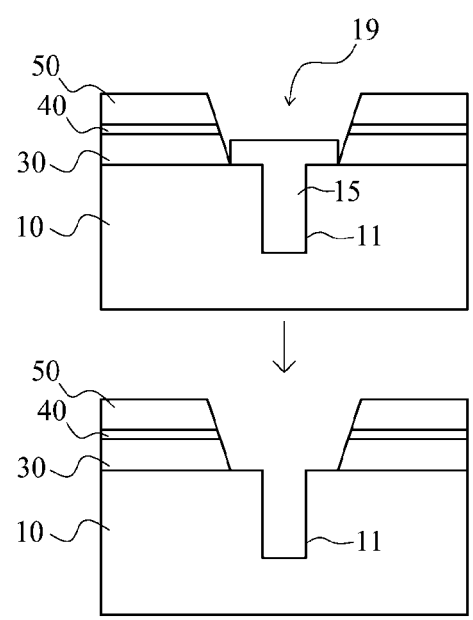
FIG. 21 is a view showing a still further embodiment of a manufacturing method of a semiconductor light-emitting device according to the present disclosure.

FIG. 21 is a view showing a still further embodiment of a manufacturing method of a semiconductor light-emitting device according to the present disclosure. First, a substrate piercing portion 11 is formed in a substrate 10, a growth barrier film 15 (e.g., $SiO_2$) is formed thereon, and semiconductor layers 30, 40 and 50 are grown. The substrate piercing portion 11 is formed prior to the growth of the semiconductor layers 30, 40 and 50, which prevents the semiconductor layers 30, 40 and 50 from being damaged by a laser.

Next, the growth barrier film 15 is removed. The succeeding process is the same as in the above.

Various embodiments of the present disclosure will now be described.

(1) A semiconductor light-emitting device, wherein the substrate piercing portion has an extended portion on the first surface.

(2) A semiconductor light-emitting device, wherein the substrate is exposed between the at least one semiconductor stacked body and the substrate piercing portion.

(3) A semiconductor light-emitting device, wherein the electrical path leads onto the exposed surface.

(4) A semiconductor light-emitting device, wherein the electrical path leads to the second semiconductor layer.

(5) A semiconductor light-emitting device comprising a bonding pad disposed on the exposed surface. A wire bonding is done on the bonding pad.

(6) A semiconductor light-emitting device, comprising a rear electrode having an opening communicating with the substrate piercing portion and an insert filled in the opening and the substrate piercing portion.

(7) A semiconductor light-emitting device, wherein the electrical path leads to the exposed surface of one semiconductor stacked body and also leads to the second semiconductor layer of another semiconductor stacked body.

(8) A semiconductor light-emitting device, wherein the electrical path has a finger extended to make electrical contact with the at least one semiconductor stacked body.

(9) A semiconductor light-emitting device, wherein the finger is extended into the semiconductor light-emitting device.

(10) A semiconductor light-emitting device, wherein the finger is a T-shaped branch.

(11) A semiconductor light-emitting device, wherein the finger forms a closed loop.

(12) A semiconductor light-emitting device, comprising an additional substrate piercing portion leading from the second surface to the first surface with a spacing from the exposed surface and opened without being covered with the at least one semiconductor stacked body, and an additional electrical path leading to the at least one semiconductor stacked body via the additional substrate piercing portion and electrically connected to the electrical path on the rear surface of the substrate.

(13) A semiconductor light-emitting device, comprising an additional substrate piercing portion leading from the second surface to the first surface with a spacing from the exposed surface and opened without being covered with the at least one semiconductor stacked body, an additional electrical path leading to the at least one semiconductor stacked body via the additional substrate piercing portion, and a finger connecting the electrical path to the additional electrical path on the exposed surface.

(14) A semiconductor light-emitting device, comprising a light absorption barrier layer disposed in the substrate piercing portion.

(15) A semiconductor light-emitting device, wherein the electrical path includes at least one metal film and a plating insert. The electrical path may be formed only by an n-side electrode 80, or may be formed by an insert 81, the n-side electrode 80, the insert 81 and a metal film 83. The metal film 83 is mostly formed by the same material as the n-side electrode 81 in the same way, in this viewpoint the n-side electrode 81 can be understood one of the metal film 83.

(16) A semiconductor light-emitting device, wherein the electrical path is formed by the two metal films and the plating insert, and one of the two metal films leads to the at least one semiconductor stacked body.

A semiconductor light-emitting device according to the present disclosure allows an electrode to be electrically connected to the rear surface of a substrate without removing the substrate.

A semiconductor light-emitting device according to the present disclosure definitely ensures that an electrical path leads from an electrode to the rear surface of a substrate by an extended portion.

A semiconductor light-emitting device according to the present disclosure allows an electrode to be electrically connected to the rear surface of a substrate without damaging semiconductor layers.

A semiconductor light-emitting device according to the present disclosure reduces the number of wire bonding in the package formation.

A semiconductor light-emitting device according to the present disclosure can form a flip chip-type package having many advantages.

A semiconductor light-emitting device according to the present disclosure can prevent a bonding pad from falling off.

A semiconductor light-emitting device according to the present disclosure can prevent a bonding pad from falling off by removing p-side wire bonding.

A semiconductor light-emitting device according to the present disclosure can be protected from an external electrical shock (e.g., ESD).

The invention claimed is:

1. A semiconductor light-emitting device, comprising:
    a substrate having a first surface and a second surface;
    at least one semiconductor stacked body disposed on the first surface of the substrate and each including an active layer and first and second semiconductor layers disposed on both sides of the active layer, the first semiconductor layer having first conductivity, the second semiconductor layer having second conductivity different than the first conductivity, the first semiconductor layer having an exposed surface;
    a substrate piercing portion leading from the second surface to the first surface with a spacing from the exposed surface and opened without being covered with the at least one semiconductor stacked body; and
    an electrical path leading to the at least one semiconductor stacked body via the substrate piercing portion.

2. The semiconductor light-emitting device as claimed in claim 1, wherein the substrate piercing portion has an extended portion on the first surface.

3. The semiconductor light-emitting device as claimed in claim 1, wherein the substrate is exposed between the at least one semiconductor stacked body and the substrate piercing portion.

4. The semiconductor light-emitting device as claimed in claim 2, wherein the substrate is exposed between the at least one semiconductor stacked body and the substrate piercing portion.

5. The semiconductor light-emitting device as claimed in claim 1, wherein the electrical path leads onto the exposed surface.

6. The semiconductor light-emitting device as claimed in claim 1, wherein the electrical path leads to the second semiconductor layer.

7. The semiconductor light-emitting device as claimed in claim 1, comprising a bonding pad disposed on the exposed surface.

8. The semiconductor light-emitting device as claimed in claim 6, comprising a bonding pad disposed on the exposed surface.

9. The semiconductor light-emitting device as claimed in claim 6, comprising:
a rear electrode having an opening communicating with the substrate piercing portion; and
an insert filled in the opening and the substrate piercing portion.

10. The semiconductor light-emitting device as claimed in claim 1, wherein the electrical path leads to the exposed surface of one semiconductor stacked body and also leads to the second semiconductor layer of another semiconductor stacked body.

11. The semiconductor light-emitting device as claimed in claim 10, wherein the second semiconductor layer of the one semiconductor stacked body is electrically connected to the exposed surface of the another semiconductor stacked body.

12. The semiconductor light-emitting device as claimed in claim 1, wherein the electrical path has a finger extended to make electrical contact with the at least one semiconductor stacked body.

13. The semiconductor light-emitting device as claimed in claim 12, wherein the finger is extended into the semiconductor light-emitting device.

14. The semiconductor light-emitting device as claimed in claim 12, wherein the finger is a T-shaped branch.

15. The semiconductor light-emitting device as claimed in claim 12, wherein the finger forms a closed loop.

16. The semiconductor light-emitting device as claimed in claim 1, comprising:
an additional substrate piercing portion leading from the second surface to the first surface with a spacing from the exposed surface and opened without being covered with the at least one semiconductor stacked body; and
an additional electrical path leading to the at least one semiconductor stacked body via the additional substrate piercing portion and electrically connected to the electrical path on the rear surface of the substrate.

17. The semiconductor light-emitting device as claimed in claim 1, comprising:
an additional substrate piercing portion leading from the second surface to the first surface with a spacing from the exposed surface and opened without being covered with the at least one semiconductor stacked body;
an additional electrical path leading to the at least one semiconductor stacked body via the additional substrate piercing portion; and
a finger connecting the electrical path to the additional electrical path on the exposed surface.

18. The semiconductor light-emitting device as claimed in claim 1, comprising a light absorption barrier layer disposed in the substrate piercing portion.

19. The semiconductor light-emitting device as claimed in claim 1, wherein the electrical path includes at least one metal film and a plating insert.

20. The semiconductor light-emitting device as claimed in claim 19, wherein the electrical path is formed by the two metal films and the plating insert, and one of the two metal films leads to the at least one semiconductor stacked body.

* * * * *